(12) United States Patent
You

(10) Patent No.: US 6,825,783 B2
(45) Date of Patent: Nov. 30, 2004

(54) MULTI-STAGE ANALOG-TO-DIGITAL CONVERTER WITH PIPELINE STRUCTURE AND METHOD FOR CODING THE SAME

(75) Inventor: Seung-bin You, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/659,592

(22) Filed: Sep. 10, 2003

(65) Prior Publication Data

US 2004/0070530 A1 Apr. 15, 2004

(30) Foreign Application Priority Data

Oct. 15, 2002 (KR) ................................ 10-2002-0062844

(51) Int. Cl.[7] .............................................. H03M 1/06
(52) U.S. Cl. ...................................... 341/118; 341/155
(58) Field of Search ................................ 341/118, 155, 341/161, 159, 120

(56) References Cited

U.S. PATENT DOCUMENTS 5,635,937 A * 6/1997 Lim et al. .................. 341/161
5,977,894 A * 11/1999 McCarroll et al. .......... 341/120

* cited by examiner

Primary Examiner—Brian Young
(74) Attorney, Agent, or Firm—F. Chau & Associates, LLC

(57) ABSTRACT

Disclosed are a multi-stage A/D converter with pipeline structure and a coding method for designing the same, wherein the multi-stage A/D converter comprises a sample-and-hold unit for receiving, sampling and holding analog input signals, a converter section having a plurality of stages for receiving an output of the sample-and-hold unit and generating digital data with a predetermined number of bits, and a correction circuit for correcting an offset error by overlapping an LSB of data of a previous stage and an MSB of data of a subsequent stage when an offset error is caused in the previous stage, receiving the digital data from each stage of the converter section, and outputting digital output data, wherein a second stage of the converter section has an error correction bit for correcting an error caused in a first stage but a third and other stages coming after the third stage do not have an error correction bit.

18 Claims, 3 Drawing Sheets

US 6,825,783 B2

MULTI-STAGE ANALOG-TO-DIGITAL CONVERTER WITH PIPELINE STRUCTURE AND METHOD FOR CODING THE SAME

CROSS-REFERENCE TO RELATED APPLICATION

This U.S. nonprovisional patent application claims priority under 35 U.S.C. § 119 to Korean Patent Application 2002-62844, filed on Oct. 15, 2002.

BACKGROUND OF THE INVENTION

1. Field of the Invention

The present invention relates to analog-to-digital ("A/D") converters, and more particularly to a multiple stage A/D converter with a pipeline structure.

2. Description of Related Art

Generally, in designing an A/D converter with a pipeline structure, a one-bit overlap coding technique is used that overlaps one bit of digital data in each stage to a bit of digital data in corresponding next stages for correcting an offset error caused in the stage. For example, a three-stage A/D converter for producing 10-bit data is designed to have 4-bit data in each stage from a first to third stages, and 1 bit of data in the respective second and third stages is used for error correction, so that an error caused in a previous stage is corrected in a subsequent stage.

However, an A/D converter with an error correction function described above takes up two times the area and consumes two times the power in comparison with an A/D converter without an error correction bit for each stage. However, since an A/D converter without an offset error correction function does not operate correctly, an error correction bit must be used in an A/D converter with a pipeline structure.

As shown in FIG. 1, a conventional coding method for implementing an A/D converter is indicated generally by the reference numeral 100. The coding method 100 is of a 4 stage A/D converter for processing 14-bit data. A first stage has 5 bits of data, while a second, third, fourth and fifth stage each has 4 bits of data, respectively. In the second and third stages, one bit of data is used as an error correction bit for correcting an error caused in a corresponding previous stage.

In the method 100, a normal range does not have an offset error therein. Thus, the result of a previous stage, such as a first stage that falls in the normal range, is used in a next stage, such as a second stage. An ADD1 and a SUB1 are signals for adding or subtracting one bit to or from a result of a previous stage, respectively, when there is an offset error detected in data of the previous stage.

The conventional multi-stage A/D converter as described above is disadvantageous in that its circuitry is complicated, takes up a large area on a chip, and consumes a high amount of power because every stage from a second stage to the last stage has an error correction bit.

SUMMARY OF THE INVENTION

It is a feature of embodiments of the present invention to provide a multi-stage A/D converter with a pipeline structure, which has an error correction bit in the data of only a second stage.

It is another feature of embodiments of the present invention to provide a multiple stage A/D converter with a pipeline structure capable of being implemented in a small chip and consuming a small amount of power.

It is a further feature of embodiments of the present invention to provide a coding method of a multi-stage A/D converter with a pipeline structure.

In accordance with one aspect of the present invention, there is provided a multi-stage A/D converter with a pipeline structure comprising (a) a sample-and-hold unit for receiving, sampling and holding analog input signals, (b) a converter section being comprised of a plurality of stages for receiving an output of the sample-and-hold unit and generating digital data with a predetermined number of bits, and (c) a correction circuit for correcting an offset error by overlapping a least significant bit ("LSB") of data of a previous stage and a most significant bit ("MSB") of data of a subsequent stage when an offset error is caused in the previous stage, receiving the digital data from each stage of the converter section, and outputting digital output data, wherein a second stage of the converter section has an error correction bit in the digital data thereof for correcting an error caused in a first stage but a third and other stages coming after the third stage do not have an error correction bit.

Preferably, each stage of the converter section may comprise a flash converter for receiving the output of the sample-and-hold unit and generating digital signals corresponding to the received analog signals, and a multiplying digital-to-analog converter ("MDAC") for receiving the digital signals from the flash converter, converting the received digital signals to analog signals, acquiring a difference between the output of the sample-and-hold unit and the converted analog signals, making a residue signal using the difference, and amplifying the residue signal.

Preferably, the converter section may comprise a first stage having the flash converter with 5 bits and the MDAC with 5 bits, a second stage having the flash converter with 4 bits and the MDAC with 4 bits, a third stage having the flash converter with 3 bits and the MDAC with 3 bits, and a fourth stage having the flash converter with 3 bits, and wherein the second stage has the error correction bit for correcting the error caused in the first stage and a total of 14 bits of digital output data are generated from the A/D converter.

Preferably, gains for the MDACs of the first and the second stages may be 16, respectively, and a gain of the MDAC of the third stage may be 8.

In accordance with another aspect of the present invention, there is provided a coding method for designing a multi-stage A/D converter with pipeline structure comprising (a) a sample-and-hold unit for receiving, sampling and holding analog input signals, (b) a converter section being comprised of a plurality of stages for receiving an output of the sample-and-hold unit and generating digital data with a predetermined number of bits, and (c) a correction circuit for correcting an offset error by overlapping an LSB of data of a previous stage and an MSB of data of a subsequent stage when an offset error is caused in the previous stage, receiving the digital data from each stage of the converter section, and outputting digital output data, wherein a second stage of the converter section has an error correction bit in the digital data thereof for correcting an error caused in a first stage but a third and other stages coming after the third stage do not have an error correction bit.

BRIEF DESCRIPTION OF THE DRAWINGS

The above and other features and advantages of the present invention will become readily apparent to those of ordinary skill in the pertinent art by describing in detail preferred embodiments thereof with reference to the attached drawings, in which.

DETAILED DESCRIPTION OF PREFERRED EMBODIMENTS

Figure 1:
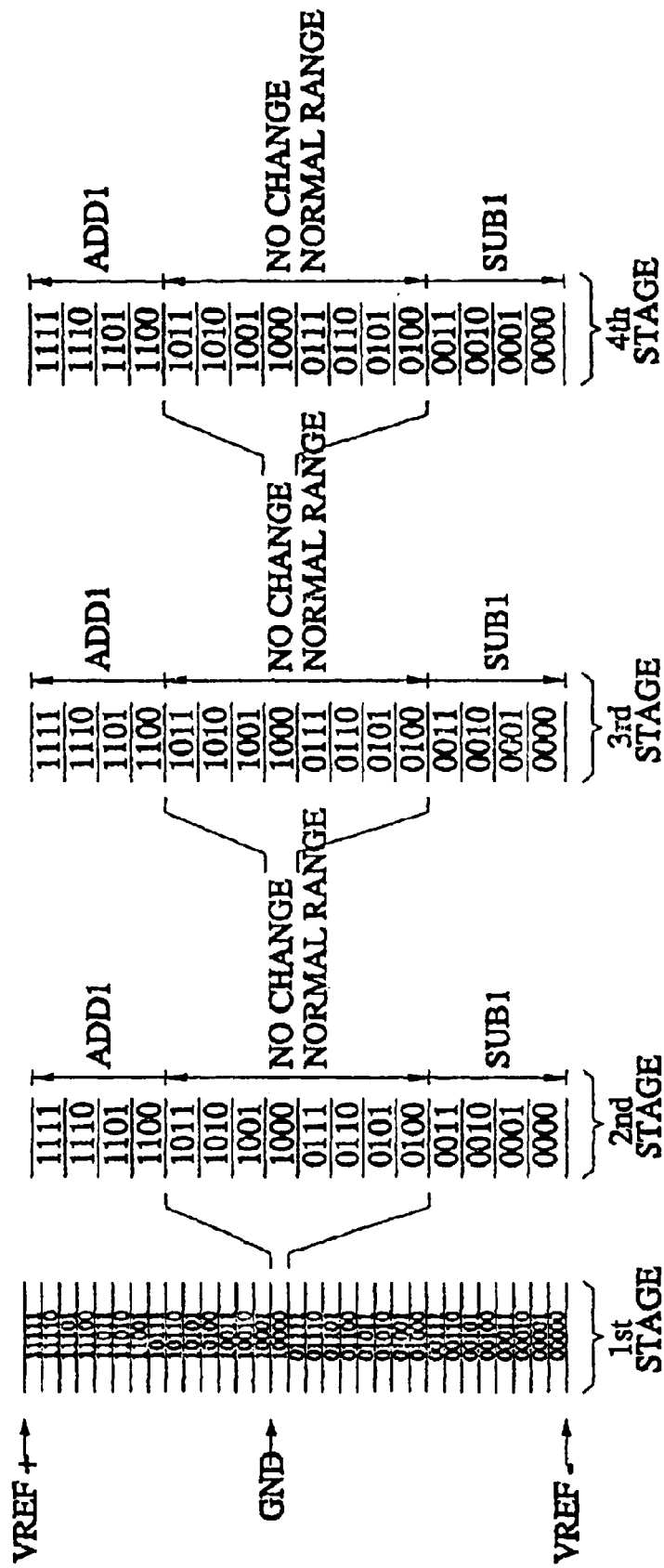
FIG. 1 shows a coding method of an A/D converter in accordance with the conventional art.

Hereinafter, the present invention will be described in detail by describing preferred embodiments thereof with reference to the accompanying drawings. Like reference numerals refer to like elements throughout the drawings.

Figure 2:
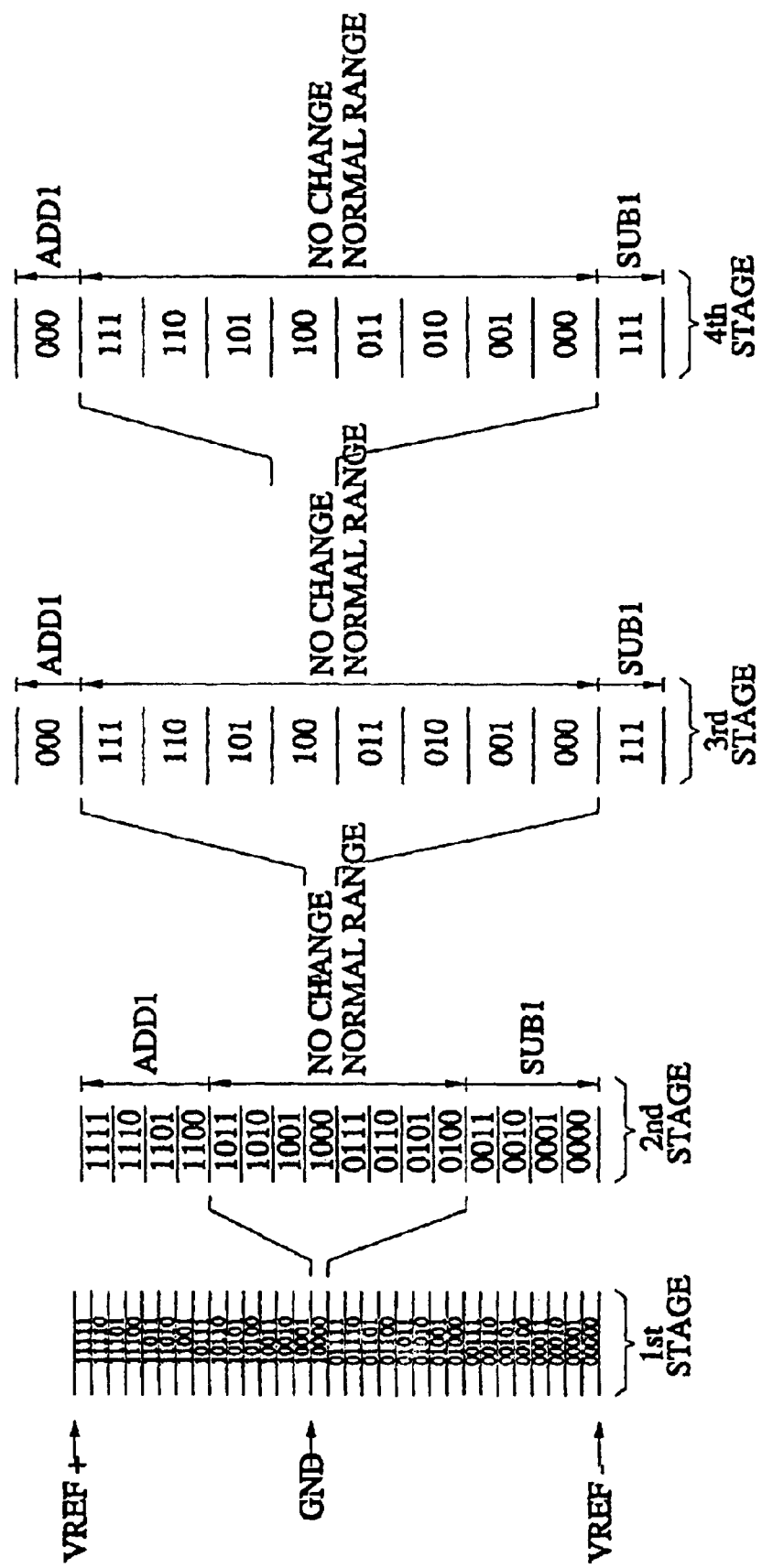
FIG. 2 shows a coding method of an A/D converter in accordance with the present invention.

As shown in FIG. 2, a coding method for use in implementing an A/D converter in accordance with the present invention is indicated generally by the reference numeral 200. In the coding method 200, there is no offset error in a normal range so that a normal range output of a previous stage is used in the next stage without any correction. ADD1 and SUB1 are signals for adding or subtracting a bit to or from an output of a previous stage when an offset error is detected in the previous stage. 5 bits of data are determined in a first stage and are amplified with a gain of 16.

The amplified 5 bits of data are transmitted to a second stage. In the second stage, the upper 4 bits and lower 4 bits are used as error correction areas. Thus, 4 bits of output, including 3 bits for the digital signal data and 1 bit for error correction, are determined and amplified with a gain of 16 in the second stage. The 4 bits of output amplified in the second stage are transmitted to a third stage. The third stage amplifies the 4 bits of output with a gain of 8 and transmits the amplified output to a fourth stage.

The third stage uses all of the areas as data conversion areas. The fourth stage also uses all of the areas for data conversion. The Least Significant Bit ("LSB") of the first stage is 2VREF/32 and the LSB of the second stage is 2VREF/16. LSBs of the third and fourth stages are 2VREF/8, respectively. Since one bit of data is used as an error correction bit in the second stage, an offset error in a range of $$\pm \frac{1}{2} LSB,$$

caused in the first stage, can be corrected.

On the other hand, since the third stage and the fourth stages do not have an error correction bit, an offset error only in a range of $$\pm \frac{1}{8} LSB$$

can be corrected in the third and fourth stages. However, the absolute value of the LSB of the third and the fourth stages are 2VREF/8, respectively. That is, the absolute value of the LSB of the third and fourth stages are 4 times of the absolute value 2VREF/32 of the first stage, so absolute values in the error correction range are almost the same in the first to fourth stages.

Accordingly, the A/D converter may operate without causing any problem even though only the second stage has the error correction bit and other stages coming after the second stage do not have error correction bits in data of their respective stages.

Figure 3:
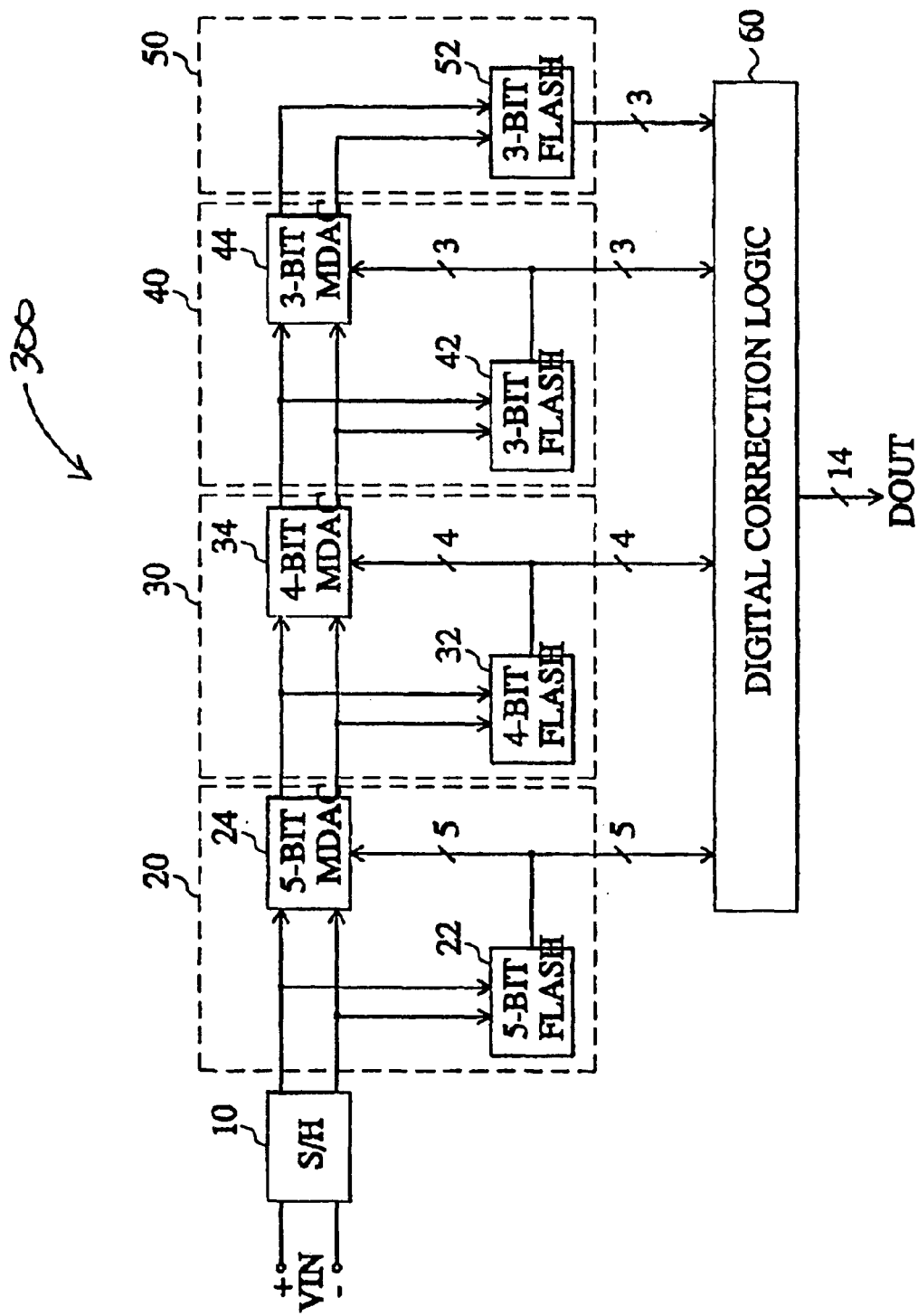
FIG. 3 shows a block diagram of an A/D converter designed in accordance with the coding method of FIG. 2.

Turning now to FIG. 3, a multi-stage A/D converter, indicated generally by the reference numeral 300, is designed in accordance with the coding method 200 of FIG. 2. The A/D converter 300 of FIG. 3 comprises a first stage converter 20 having a 5-bit flash converter 22 and a 5-bit Multiplying Digital-to-Analog Converter ("MDAC") 24, a second stage converter 30 having a 4-bit flash converter 32 and a 4-bit MDAC 34, a third stage converter 40 having a 3-bit flash converter 42 and a 3-bit MDAC 44, a fourth stage converter 50 having a 3-bit flash converter 52, and a correction circuit 60.

The operation of an A/D converter in accordance with the present invention will be described with respect to the multi-stage A/D converter 300 of FIG. 3. The AND converter 300 has 4 stages and produces 14-bit digital data. The first stage converter 20, second stage converter 30, third stage converter 40 and fourth stage converter 50 generate 5 bits, 3 bits, 3 bits and 3 bits of digital data, respectively. In the second stage converter 30, a one bit digital signal out of the 4-bit digital data is used for correcting an error caused in the first stage converter 20 after a sample-and-hold unit 10 receives, samples and holds analog input signals VIN.

In the first stage converter 20, the 5-bit flash converter 22 receives an output of the sample-and-hold unit 10 and generates 5 bits of digital signals corresponding to the received analog signals. The 5-bit MDAC 24 of the first stage converter 20 receives the 5 bits of the digital signals from the 5-bit flash converter 22, converts them to analog signals, compares the converted analog signals and the output, original analog signals, of the sample-and-hold unit 10, makes a residue signal using the difference between the converted analog signals and the original analog signals, and amplifies the residue signal. The amplifying gain of the 5-bit MDAC 24 is 16.

The 4-bit flash converter 32 of the second stage converter 30 receives an output of the 5-bit MDAC 24 and generates 4 bits of digital signals corresponding to the received analog signals. The 4-bit MDAC 34 of the second stage converter 30 receives the 4 bits of digital signals from the 4-bit flash converter 32, converts them to analog signals, acquires a difference between the analog signals converted therein and the output, which are analog signals, of the 5-bit MDAC 24, makes a residue signal, and amplifies the residue signal. The gain of the 4-bit MDAC 34 is 16.

The 3-bit flash converter 42 of the third stage converter 40 receives the output of the 4-bit MDAC 34 and generates 3 bits of digital signals corresponding to the received analog signals. The 3-bit MDAC 44 of the third stage converter 40 receives the 3 bits of digital signals from the 3-bit flash converter 42 and converts them to analog signals. Further, the 3-bit MDAC 44 of the third stage converter 40 acquires a difference between the analog signals converted thereby and the output of the 4-bit MDAC 34, makes a residue signal using the difference and amplifies the residue signal. The amplifying gain of the 3-bit MDAC 44 is 8.

The 3-bit flash converter 52 of the fourth stage converter 40 receives an output of the 3-bit MDAC 44 and generates 3 bits of digital signals corresponding to the received analog signals. The correction circuit 60 corrects an offset error by overlapping an LSB of a previous stage and a Most Significant Bit ("MSB") of a subsequent stage when an offset error is caused in the previous stage, receives the digital signal outputs of all the stages, and outputs 14 bits of digital output data DOUT.

As described above, an A/D converter in accordance with the present invention has an error correction bit only in the second stage but has no error correction bit in later stages.

Accordingly, the third and fourth stages of the exemplary A/D converter in accordance with the present invention may be implemented in a reduced chip size with third and fourth stages of about ½ the sizes of the third and fourth stages of a conventional A/D converter, and the exemplary A/D converter has a correspondingly reduced power consumption, thereby reducing the chip size and a power by about 30% overall in comparison with a conventional A/D converter.

Preferred embodiments of the present invention have been disclosed herein and, although specific terms are employed, they are used and are to be interpreted in a generic and descriptive sense only and not for the purpose of limitation. Accordingly, it will be understood by those of ordinary skill in the pertinent art that various changes in form and details may be made without departing from the spirit and scope of the present invention as set forth in the following claims.

What is claimed is:

1. A multi-stage analog-to-digital ("A/D") converter with pipeline structure comprising:

a sample-and-hold unit for receiving, sampling and holding analog input signals;

a converter section having a plurality of stages for receiving an output of the sample-and-hold unit and generating digital data with a predetermined number of bits; and a correction circuit for correcting an offset error by overlapping a least significant bit ("LSB") of data from a previous stage with a most significant bit ("MSB") of data from a subsequent stage when an offset error is caused in the previous stage, receiving the digital data from each stage of the converter section, and outputting digital output data, wherein a second stage of the converter section has an error correction bit in the digital data thereof for correcting an error caused in a first stage but a third and other stages coming after the third stage do not have an error correction bit.

2. The A/D converter according to claim 1, wherein each stage of the converter section comprises:

a flash converter for receiving the analog output signals of the sample-and-hold unit and generating digital signals corresponding to the received analog signals; and a multiplying digital-to-analog converter ("MDAC") for receiving the digital signals from the flash converter, converting the received digital signals to analog signals, acquiring a difference between the output of the sample-and-hold unit and the converted analog signals, making a residue signal using the difference, and amplifying the residue signal.

3. The A/D converter according to claim 2, wherein the converter section comprises a first stage having a flash converter with 5 bits and an MDAC with 5 bits, a second stage having a flash converter with 4 bits and an MDAC with 4 bits, a third stage having a flash converter with 3 bits and an MDAC with 3 bits, and a fourth stage having a flash converter with 3 bits, and wherein the second stage has the error correction bit for correcting the error caused in the first stage and 14 bits of digital output data are generated from the A/D converter.

4. The A/D converter according to claim 3, wherein gains of the MDAC of the first and the second stage are 16, respectively, and a gain of the MDAC of the third stage is 8.

5. An analog-to-digital ("A/D") converter comprising:

sample-and-hold means for receiving, sampling and holding analog input signals;

multi-stage conversion means for receiving an analog output of the sample-and-hold means and generating digital data with a predetermined number of bits wherein a single stage of the conversion means has an error correction bit in the digital data thereof for correcting an error caused in a prior stage; and correction means for correcting an offset error by overlapping a least significant bit ("LSB") of data from a previous stage with a most significant bit ("MSB") of data from a subsequent stage when an offset error exists in the previous stage, receiving the digital data from each stage of the converter section, and outputting digital results.

6. An analog-to-digital ("A/D") converter comprising:

a converter portion having at least three pipelined stages for receiving an analog input and generating a digital output;

an error correction portion in signal communication with the second of the at least three stages for correcting an error caused in the first of the at least three stages by updating an error correction bit;

flashing means for receiving analog output signals from the sample-and-hold means and generating digital signals corresponding to the received analog signals; and multiplying means for receiving the digital signals from the flashing means, converting the received digital signals to analog signals, acquiring a difference between the output of the sample-and-hold means and the converted analog signals, making a residue signal using the difference, and amplifying the residue signal.

7. An A/D converter as defined in claim 6 wherein the multi-stage conversion means comprises a first stage having a flash converter with 5 bits and a multiplying digital-to-analog converter ("MDAC") with 5 bits, a second stage having a flash converter with 4 bits and an MDAC with 4 bits, a third stage having a flash converter with 3 bits and an MOAC with 3 bits, and a fourth stage having a flash converter with 3 bits, and wherein the second stage has the error correction means for correcting the error caused in only the first stage in accordance with an error correction bit.

8. An A/D converter as defined in claim 7 wherein the MDACs of the first and second stages each provide gains of 16, respectively, and the MDAC of the third stage provides a gain of 8.

9. An A/D converter as defined in claim 5 wherein the single stage having the error correction bit provides a gain at least twice as great as the gains provided by each subsequent stage of the multi-stage conversion means.

10. A coding method of a multi-stage analog-to-digital ("A/D") converter with pipeline structure comprising (a) a sample-and-hold unit for receiving, sampling and holding analog input signals, (b) a converter section having a plurality of stages for receiving an output of the sample-and-hold unit and generating digital data with a predetermined number of bits, and (c) a correction circuit for correcting an offset error by overlapping a least significant bit ("LSB") of data of a previous stage and a most significant bit ("MSB") of data of a subsequent stage when an offset error is caused in the previous stage, receiving the digital data from each stage of the converter section, and outputting digital output data, wherein a second stage of the converter section has an error correction bit in the digital data thereof for correcting an error caused in a first stage but a third and other stages coming after the third stage do not have an error correction bit.

11. A method of converting an analog input signal into a digital output signal, the method comprising:

receiving an analog input signal;

providing at least one subsequent stage of a multi-stage pipelined structure for converting a portion of the received analog signal into a plurality of digital bits without an error bit; and receiving digital data from each staae of the multi-stage pipelined structure, and outputting combined digital output data including all bits from all stages with the single exception of an error correction bit from a subsequent but non-final stage for correcting an error caused in a previous stage.

12. A method as defined in claim 11, further comprising:

sampling and holding the received analog input signal;

receiving the sampled and held signal and generating corresponding digital data having a predetermined number of bits;

correcting an offset error by overlapping a least significant bit ("LSB") of data from a previous stage with a most significant bit ("MSB") of data from a subsequent stage when an offset error is caused in the previous stage.

13. A method as defined in claim 12, further comprising:

receiving the sampled and held analog signals and generating digital signals corresponding to the received analog signals; and converting the generated digital signals into analog signals, acquiring a difference between the original sampled and held analog signals and the converted analog signals, making a residue signal using the difference, and amplifying the residue signal.

14. A method as defined in claim 11, further comprising:

converting the least significant portion of the analog signal into 5 bits at a first stage;

converting the next more significant portion of the analog signal into 3 bits plus an error correction bit at a second stage;

converting the next more significant portion of the analog signal into 3 bits at a third stage; and converting the most significant portion of the analog signal into 3 bits at a fourth stage to generate 14 bits of digital output data.

15. A method as defined in claim 14, further comprising:

providing gains at the first and the second stages of 16, respectively, and a gain of at the third stage of 8.

16. A method as defined in claim 12, further comprising:

receiving the sampled and held analog signal and generating digital data with a predetermined number of bits wherein a single stage of a multi-staged pipelined structure supports an error correction bit in the digital data thereof for correcting an error caused in a prior stage; and correcting an offset error by overlapping a least significant bit ("LSB") of data from a previous stage with a most significant bit ("MSB") of data from a subsequent stage when an offset error exists in the previous stage, receiving the digital data from each stage of the converter section, and outputting combined digital results.

17. A method as defined in claim 12, further comprising:

flashing the sampled and held analog signal and generating a digital signal corresponding to the flashed analog signal; and converting the generated digital signal into an analog signal, acquiring a difference between the output of the sampled and held analog signal and the converted analog signal, making a residue signal using the difference, and amplifying the residue signal.

18. A method as defined in claim 12, further comprising:

providing a gain at a stage that supports an error correction bit of at least twice as great as the gain provided by each subsequent stage of a multi-stage pipelined structure.

* * * * *